United States Patent [19]
Petit

[11] Patent Number: 6,049,971
[45] Date of Patent: Apr. 18, 2000

[54] CASING FOR INTEGRATED CIRCUIT CHIPS AND METHOD OF FABRICATION

[75] Inventor: Luc Petit, Fontaine, France

[73] Assignee: SGS-Thomson Microelectronics S.A., Gentilly, France

[21] Appl. No.: 08/876,016

[22] Filed: Jun. 13, 1997

Related U.S. Application Data

[62] Division of application No. 08/624,691, Mar. 27, 1996.

[30] Foreign Application Priority Data

Mar. 31, 1995 [FR] France .................................. 95 04065

[51] Int. Cl.⁷ ..................................................... H01R 43/00
[52] U.S. Cl. ............................ 29/827; 174/52.2; 438/122
[58] Field of Search ............................. 29/827; 174/52.2; 438/122

[56] References Cited

U.S. PATENT DOCUMENTS

| | | | |
|---|---|---|---|
| 4,079,511 | 3/1978 | Grabbe | 29/827 |
| 5,161,304 | 11/1992 | Queyssac et al. | 29/827 |
| 5,202,288 | 4/1993 | Doering et al. | 29/827 |
| 5,249,354 | 10/1993 | Richman | 29/827 |
| 5,256,598 | 10/1993 | Farnworth et al. | 437/220 |
| 5,366,933 | 11/1994 | Golwalkar et al. | 29/827 |
| 5,422,435 | 6/1995 | Takiar et al. | 29/827 X |
| 5,440,170 | 8/1995 | Tsuji et al. | 257/676 |
| 5,614,441 | 3/1997 | Hosokawa et al. | 29/827 |

FOREIGN PATENT DOCUMENTS 60-070752  4/1985  Japan .

OTHER PUBLICATIONS

French Search Report from French Patent Application No. 95 04065, filed Mar. 31, 1995.
Patent Abstracts of Japan, vol. 018, No. 643 (E–1640), Dec. 7, 1994 & JP–A–06 252330 (Dainippon Printing Co., Ltd).
Patent Abstracts of Japan, vol. 017, No. 344 (E–1390), Jun. 29, 1993 & JP–A–05 047986 (Fujitsu Ltd).
Patent Abstracts of Japan, vol. 007, No. 178 (E–191), Aug. 6, 1983 & JP–A–58 082540 (Tokyo Shibaura Denki KK).

*Primary Examiner*—Carl J. Arbee
*Attorney, Agent, or Firm*—Wolf, Greenfield & Sacks, P.C.; James H. Morris; Theodore E. Galanthay

[57] ABSTRACT

A method for fabricating a lead frame that includes a platform attached thereto for mounting a chip. A base frame is provided for mounting chips of various sizes. The base frame includes connection leads extending toward a central portion, which is substantially of the size of the smallest chip to mount. Connection leads are cut-out about the central portion to form an opening corresponding to the size of the chip to be mounted. A platform is soldered to at least two support leads to form the lead frame.

15 Claims, 3 Drawing Sheets

CASING FOR INTEGRATED CIRCUIT CHIPS AND METHOD OF FABRICATION

This application is a division of application Ser. No. 08/624,691, filed Mar. 27, 1996, entitled A CASING FOR INTEGRATED CIRCUIT CHIPS AND METHOD OF FABRICATION and now pending.

BACKGROUND OF THE INVENTION

1. Field of the Invention

The present invention relates to the fabrication of a casing for integrated circuits. More particularly, the present invention relates to the fabrication of a casing for mounting an integrated circuit chip from a lead frame which defines leads for electrically connecting pads of the chip to the outside of the casing.

2. Discussion of the Related Art

FIG. 1 is a partial top view of a conventional structure of a lead frame 1 for electrically connecting a chip to the exterior of a casing. FIG. 2 is a cross-sectional view of a casing for mounting an integrated circuit chip 2 with a lead frame 1 as represented in FIG. 1. The cross-section of FIG. 2 is taken along line A–A' of FIG. 1.

The lead frame 1 is formed by a frame 1' surrounding a central platform 3 for supporting a chip 2. Connection leads 4 extend from the frame 1' toward the platform 3 without contacting the platform. Various portions of the lead frame 1 interconnect the connection leads 4 to ensure a relative rigidity during mounting. The platform 3 is supported by support leads 4' which extend between the corners of the platform and the base frame 20'. The ends of conductive wires 5, which connect each connection lead 4 to one of the pads of the chip 2, are soldered to the connection leads 4. The assembly is encapsulated in an insulating resin 6 which defines the envelope of the casing. After encapsulation, the frame 1' and the short-circuits between the connection leads 4 are cut-out. The conductive wires 5 are generally gold. The resin 6 is generally an epoxy resin, and the lead frame 1 is generally copper or iron-nickel.

The lead frame 1 is generally fabricated by mechanical punching of a copper sheet. The lead frame may be fabricated by chemical etching (e.g., photo-litho-etching), but this process is not used for mass fabrication because it is long and more expensive.

A drawback of mechanical punching is that it needs a specific punching tool for each type of chip 2 because the size of the platform 3 is adapted to the particular size of the chip 2 to limit the length of the wires 5. Although punching is fast, and therefore has a good productivity, the fabrication of each punching tool is very expensive.

In some applications where the chip 2 dissipates a large amount of heat (e.g., in power circuits), a heat sink is added beneath the platform 3 either by bonding or soldering. A drawback encountered in such an application is the addition of thermal interfaces between the chip and the heat sink, which is detrimental to energy dissipation.

To eliminate the thermal interfaces, it has been proposed in the case of power circuits to eliminate the platform 3 and to directly bond the chip 2 on a heat sink playing the role of a platform. The heat sink is mounted beneath the connection leads 4 of the lead frame 1 through an insulating material placed at the periphery of the heat sink, facing the free ends of the connection leads 4 which are the nearest to the heat sink. A drawback of such a technique is that the glue needed to affix the insulating material to the connection leads 4 of the lead frame 1 can contaminate the electrical connections between the connection leads 4 and the chip 2, whereby a large number of casings are discarded during test processes.

In addition, in some cases, the chip 2 should be electrically insulated from the heat sink or from the platform. Then, an insulating layer is placed beneath the chip, which increases the number of thermal interfaces. In addition, the insulating layer and the glue needed for the bonding are generally organic and accumulate moisture. Excessive moisture may cause cracks in the resin 6 during its oven polymerization, or subsequently, when the casing is subjected to high temperatures (e.g., wave soldering or oven soldering of surface mounted components).

SUMMARY OF THE INVENTION

It is an object of the present invention to provide an improved casing for integrated circuits and a method for its formation.

To achieve this and other objects, the present invention uses a method for realizing a lead frame, that is described in U.S. Pat. No. 5,256,598. A single lead frame is provided for mounting chips of various sizes. The frame includes connection leads extending toward a central portion, which is substantially of the size of the smallest chip to mount. The connection leads are cut-out about the central portion to form an opening corresponding to the chip to mount, and a platform for receiving the chip is attached to the lead frame.

According to the invention, the platform is made of a metal anodized at least at its periphery and is slightly larger than the opening. At least two support leads are soldered on non-anodized portions of the platform.

According to another embodiment of the invention, the chip is mounted to the platform before the connection of the platform to the frame.

According to a further embodiment of the invention, the central portion is a solid member.

In accordance with another illustrative embodiment of the present invention, an integrated circuit casing includes a lead frame provided with connection leads which extend toward a chip, and at least two support leads on separate sides of the chip to support a platform on which the chip is mounted. The platform is made of a metal which is anodized at least at its periphery and on which lie the ends of the connection leads. The support leads are soldered to a non-anodized connection portion of the platform.

According to an embodiment of the invention, the platform constitutes a heat sink.

According to another embodiment of the invention, the platform includes a non-anodized central portion for receiving the chip, and the central portion is coupled to the non-anodized connection portion.

According to a further embodiment of the invention, the platform includes a non-anodized ring surrounding the chip that is mounted on an anodized portion.

The foregoing and other objects, features, aspects and advantages of the invention will become apparent from the following detailed description of the present invention when taken in conjunction with the accompanying drawings.

BRIEF DESCRIPTION OF DRAWINGS

For the sake of clarity, the figures are not drawn to scale and the same elements are designated in the various figures with the same references.

DETAILED DESCRIPTION

Figure 1:
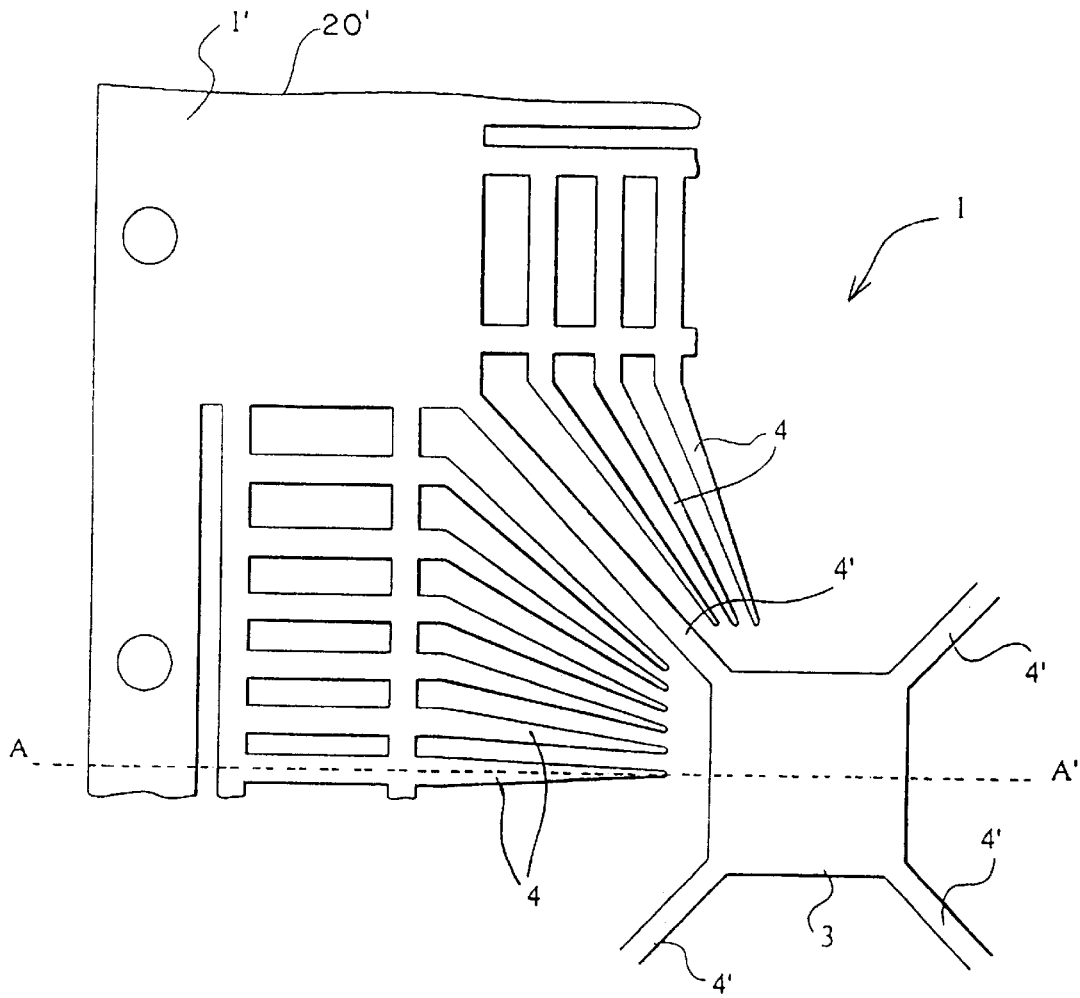
FIGS. 1 and 2, above described, disclose the state of the art and the problem encountered.
Figure 2:
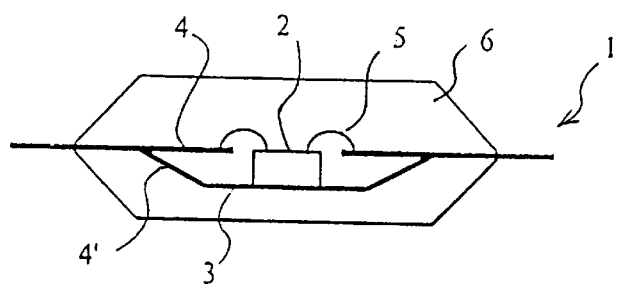
Figure 3A:
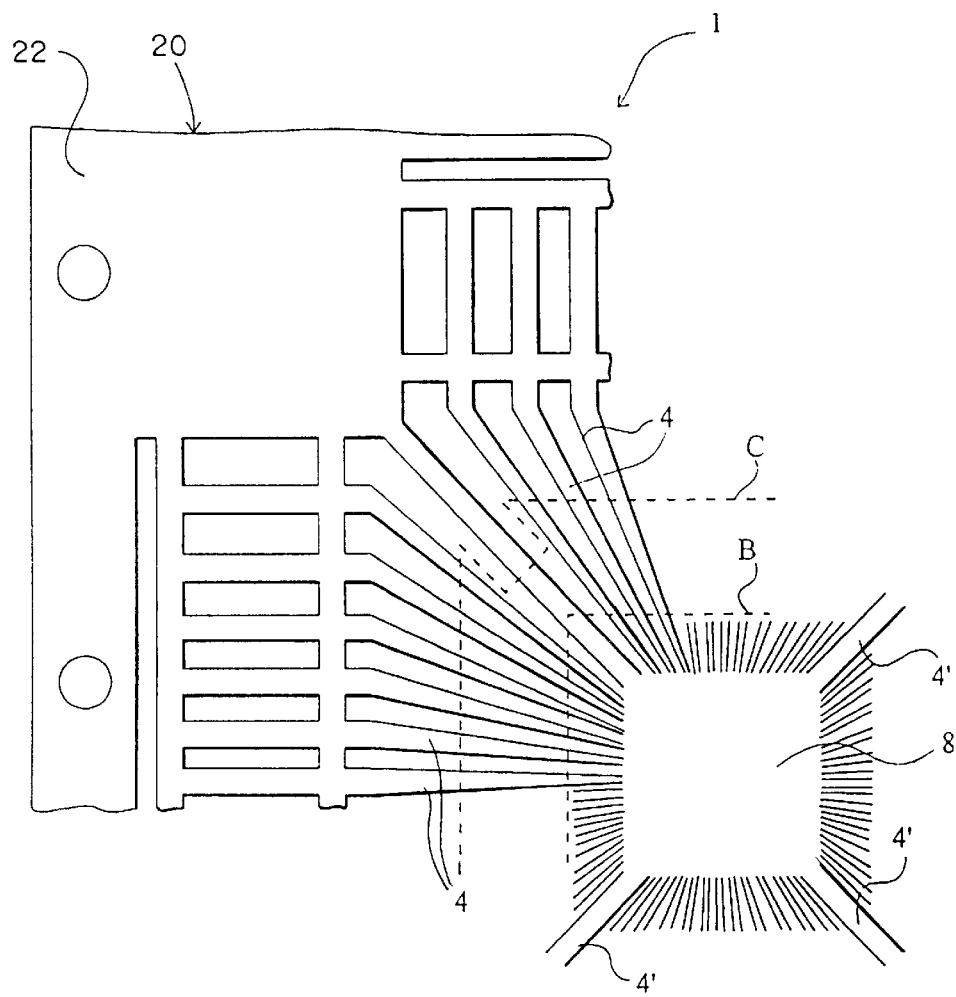
FIGS. 3A–3C are top views of an embodiment of a frame according to the invention and of two alternatives of a first embodiment of a platform according to the invention, respectively.

As represented in FIG. 3A, one illustrative embodiment of the present invention provides a lead frame 1 whose external size is adapted to a family of casings. The lead frame 1 includes a base frame 20 and a platform 3' (FIG. 3B) and 3" (FIG. 3C) connected to the base frame 20. The base frame 20 includes a frame 22 and a plurality of connection leads 4 extending from the frame 22 toward a central portion 8. The frame 22 surrounds the central portion 8 which is as small as possible, preferably as small as the smallest chip to be mounted. In other words, with a mechanical punching tool, the base frame 20 is fabricated including a central portion 8 whose size is at the limit of the mechanical feasibility of the ends of the connection leads 4 proximal to the central portion 8, if the central portion 8 cannot be as small as the smallest chip. The central portion 8 can be void or an opening, but is preferably a solid member to ensure a relative rigidity of the frame.

When mounting a chip in a casing, the base frame 20 is associated with a non-integral platform 3' (FIG. 3B) and 3" (FIG. 3C) whose size varies according to the size of the chip. The non-integral platform 3' and 3" is fabricated as a separate part independent of the base frame 20. The center of the base frame 20 is punched out as a function of the size of the platform 3' and 3" and, therefore, as a function of the size of the chip.

The platform 3' and 3" is connected to the base frame 20 by at least two support leads 4' whose ends disposed proximal to the center of base frame 20 are soldered to the platform 3' and 3". To enable this connection, the center of the base frame 20 is cut-out according to a pattern that depends on the embodiment and the shape of the platform.

Figure 3B:
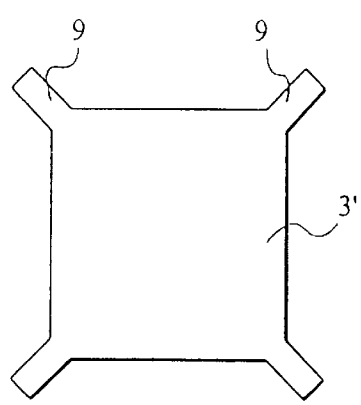

FIG. 3B represents a first alternative of a first embodiment in which the platform 3' has four protruding tabs 9, uniformly distributed in the plane of the platform 3'. The tabs 9 are, for example, disposed at the four corners of platform 3', if the platform is rectangular or square as represented in FIG. 3B. For such a platform 3', the base frame 20 is cut-out along a square that is slightly larger than the platform 3' without its tabs 9. In other words, the cut-out pattern of the base frame 20 is shaped substantially like platform 3' but is slightly larger so that the ends of the connection leads 4, proximal to the platform 3', do not contact the platform, except for the support leads 4' to which the platform 3' is soldered by its tabs 9. The cut-out area of the base frame 20 according to this alternative is represented by dotted lines B in FIG. 3A.

Figure 3C:
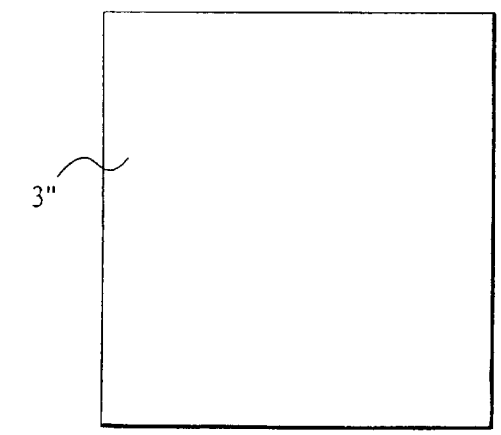

FIG. 3C illustrates a second alternative of the first embodiment in which the platform 3" is square without tabs. The base frame 20 is still cut-out along a pattern slightly larger than platform 3", but the support leads 4" are longer than the connection leads 4 of the base frame 20. Thus, when assembling the platform 3" to the base frame 20, only the support leads 4' contact the platform 3". The cut-out area of the base frame 20 according to this alternative is represented by dotted lines C in FIG. 3A.

The connection of the support leads 4' to the platform 3' and 3" can be achieved, for example, by laser point soldering.

The present invention can optimize the productivity of frame punching tools. Indeed, the same tool for punching the base frames can be used for a whole family of casings including chips of various sizes. Only simple, inexpensive punching tools for punching the central portion of the base frame are associated with each type of chip.

An advantage of the separately fabricated non-integral platform is that it allows the bonding of the chip to the platform before connection to the base frame 20. This significantly limits the risk for the base frame 20 to be damaged, which is very fragile because of its thin connection leads 4, by significantly reducing the handling of the frame. The base frame 20 is thus associated with the platform at the last step for connecting the connection leads 4 to the pads of the chip and for encapsulation.

Furthermore, the material and thickness of the platform can be different from those of the base frame. For example, it is possible to select for the base frame a material (e.g., an ironnickel alloy) having an expansion coefficient close to the expansion coefficient of the silicon constituting the chip. This is not the case for copper that is generally used for the base frame because of its electric conductivity characteristics. Adapting the expansion of the platform to the expansion of the chip can limit the risk of damaging the chip, which can occur during drying of the encapsulating resin, during the operation of the electric circuit in which the casing is used due to temperature variations, or during soldering operations (e.g., wave soldering and oven soldering).

FIGS. 4A–6B illustrate a second embodiment of the invention in which the platform acts as a heat sink.

A platform according to this embodiment is fabricated from a material that provides high thermal dissipation and can be partially coated in predetermined areas with an insulation layer. According to the invention, this material is preferably aluminum, which is anodized in predetermined areas to form electrically non-conductive areas.

Aluminum is preferred because it is an excellent thermal conductor and because the aluminum platform can be locally masked with a resist layer that withstands anodization acids. The resist layer has the characteristic of being removable by a low alkaline solution in which the anodized aluminum layer has a chemical stability of a few minutes. This delay is sufficient to remove the resist layer. The thickness of the anodized areas can vary, for example, from approximately 3 $\mu$m to 15 $\mu$m.

Thus, various alternative platforms can be achieved depending upon the surface portions which should be electrically conductive or insulating.

Figure 4A:
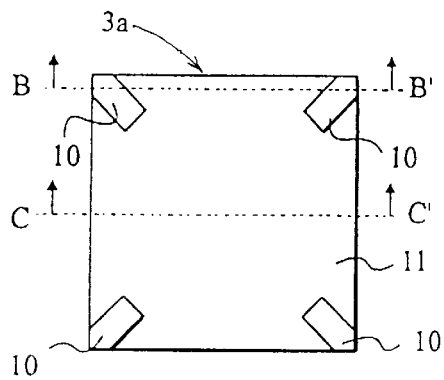
FIGS. 4A–4C are a top view and cross-sectional views of a first alternative of a second embodiment of a platform according to the invention.
Figure 4B:
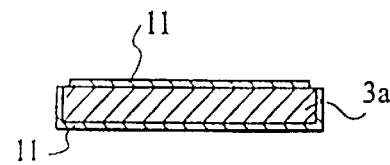
Figure 4C:
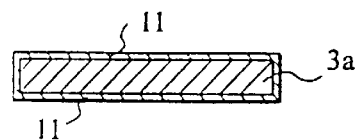

FIGS. 4A–4C illustrate a first alternative of a platform 3a made from aluminum anodized in predetermined areas. FIGS. 4B and 4C are cross-sectional views along lines B–B' and C–C', respectively, of the top view of FIG. 4A.

Platform 3a is anodized over its whole surface, except for non-anodized areas 10 intended to be soldered beneath the support leads 4'. For the sake of clarity, the anodized areas of platform 3a are represented in the cross-sectional views by a layer 11. Such an embodiment further simplifies the tool needed for punching the central portion of the base frame and punching the platform. Indeed, the base frame and the platform can be punched according to similar patterns, the central punching of the base frame being slightly smaller than the platform 3a. Thus, the ends of all the connection leads 4, proximal to the center of the base frame, lie on the platform 3a. However, no short-circuits occur because the surface of platform 3a is anodized. A platform 3a such as represented in FIGS. 4A–4C can be used, for example, to receive a chip without a bottom ground plane.

Figure 5A:
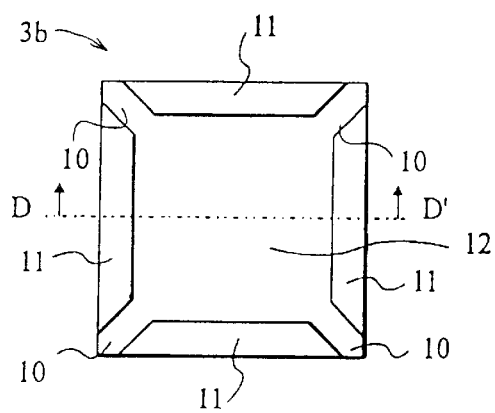
FIGS. 5A and 5B are a top view and a cross-sectional view, respectively, of a second alternative of the second embodiment of a platform according to the invention.
Figure 5B:
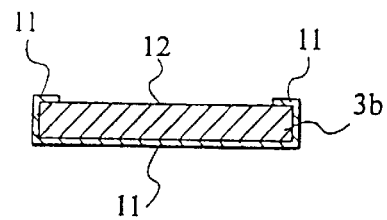

FIGS. 5A and 5B illustrate a second alternative of a platform 3b made from aluminum that is anodized in predetermined areas. FIG. 5B is a cross-sectional view along line D–D' of the top view represented in FIG. 5A.

As described above, the platform 3b is made from anodized aluminum. The non-anodized areas comprise areas 10 identical to those of FIG. 4A, but these areas 10 are joined to a nonanodized central area 12. A platform 3b as represented in FIGS. 5A and 5B can, for example, be used to receive a chip having a bottom ground plane. The ground plane is electrically connected to the exterior of the casing through the non-anodized areas 12 and 10 and the support leads 4' of the frame.

Figure 6A:
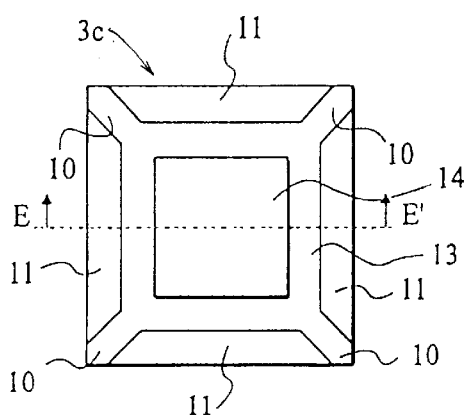
FIGS. 6A and 6B are a top view and a cross-sectional view, respectively, of a third alternative of the second embodiment of a platform according to the invention.
Figure 6B:
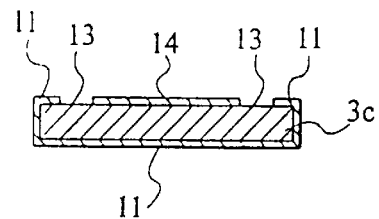

FIGS. 6A and 6B illustrate a third alternative of a platform 3c made from aluminum that is anodized in predetermined areas. FIG. 6B is a cross-sectional view along line E–E' of the top view of FIG. 6A.

As described above, the platform 3c is made from anodized aluminum. The non-anodized areas include areas 10 that are similar to those of FIG. 4A, but the non-anodized areas 10 are joined together by a non-anodized ring 13, the central area 14 of the platform being anodized. A platform 3c as represented in FIGS. 6A and 6B can, for example, be used to receive a chip without a ground plane but including a plurality of ground pads. All the connection wires of the various ground pads are drawn to the non-anodized ring 13 and are connected to the exterior of the casing through the non-anodized areas 10 and the support leads 4'.

As is apparent to those skilled in the art, various modifications can be made to the above disclosed preferred embodiments. In particular, the selection of the material constituting the base frame and the platform depends upon the application of the casing. Although the invention has been described with relation to square casings requiring square base frames, the invention also applies to any shape of casing. In addition, the base frame and the platform can have dissimilar shapes.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A method for fabricating a lead frame including a platform for mounting one of a plurality of chips thereon, the plurality of chips including chips of various sizes, the method comprising steps of:

providing a base frame adapted to mount each of the plurality of chips of various sizes, the base frame including a plurality of connection leads and at least two support leads extending toward a central portion of the base frame, the central portion having a size substantially equal to the size of a smallest of the plurality of chips;

cutting the plurality of connection leads about the central portion to form an opening corresponding to the size of the one of the plurality of chips to be mounted;

providing a platform having a periphery slightly larger than the opening and formed from a metal anodized at least at the periphery of the platform; and soldering the platform to the at least two support leads to form the lead frame, wherein the step of soldering includes soldering the at least two support leads to non-anodized portions of the platform.

2. The method recited in claim 1, wherein the step of soldering is performed after the one of the plurality of chips has been mounted to the platform.

3. The method recited in claim 1, wherein the step of providing the base frame includes providing the base frame to include a solid central portion.

4. A method for fabricating a lead frame for mounting an integrated circuit chip in an integrated circuit casing, the method comprising steps of:

(A) providing a base frame including a central portion, a plurality of connection leads extending outwardly from the central portion, each of the plurality of support leads extending outwardly from the central portion, each of the plurality of connection leads and the plurality of support leads having an inner end attached directly to the central portion;

(B) separating the central portion from the inner ends of the plurality of connection leads and the inner ends of the plurality of support leads and removing the central portion from the base frame to form an opening defined by the inner ends of the plurality of connection leads and the inner ends of the plurality of support leads; and (C) attaching a platform to the plurality of support leads to form the lead frame.

5. The method recited in claim 4, wherein step (B) includes a step of cutting the plurality of connection leads extending from the central portion.

6. The method recited in claim 5, wherein the step of cutting includes cutting the plurality of support leads to have a length of each of the plurality of connection leads.

7. The method recited in claim 4, wherein step (B) includes a step of forming the opening to have a size corresponding to a size of the integrated circuit chip that is to be mounted to the platform.

8. The method recited in claim 4, wherein steps (B) and (C) include steps of forming the opening and attaching the platform to the plurality of support leads so that, when the platform is attached to the plurality of support leads, the plurality of connection leads so not contact the platform.

9. The method recited in claim 4, wherein steps (B) and (C) include steps of forming the opening and attaching the platform to the plurality of support leads so that, when the platform is attached to the plurality of support leads, at least one of the plurality of connection leads contacts the platform.

10. The method recited in claim 9, wherein the step of forming the opening includes forming the opening to be smaller than the platform.

11. The method recited in claim 4, wherein step (C) includes a step of soldering the platform to the plurality of support leads.

12. The method recited in claim 4, further comprising a step of:

(D) providing the platform to include a center portion and a plurality of tabs extending outwardly from the center portion.

13. The method recited in claim 12, wherein step (C) includes attaching the ends of the plurality of support leads to the plurality of tabs.

14. The method recited in claim 4, further comprising a step of:
   (E) providing the platform to include an electrically conductive portion and an electrically nonconducting portion.

15. The recited in claim 14, wherein step (E) includes providing the platform to include an anodized electrically nonconductive portion.

* * * * *